(12) United States Patent
Lee et al.

(10) Patent No.: US 7,298,190 B2
(45) Date of Patent: Nov. 20, 2007

(54) PHASE LOCKED LOOP HAVING ENHANCED LOCKING CHARACTERISTICS

(75) Inventors: Seung-won Lee, Gyeonggi-do (KR);
Hwi-taek Chung, Gyeonggi-do (KR);
Byeong-hoon Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 24 days.

(21) Appl. No.: 11/247,938

(22) Filed: Oct. 11, 2005

(65) Prior Publication Data
US 2006/0139073 A1   Jun. 29, 2006

(30) Foreign Application Priority Data
Dec. 23, 2004   (KR) ................. 10-2004-0111107

(51) Int. Cl.
*H03L 7/06* (2006.01)
(52) U.S. Cl. .................. 327/158; 327/148; 331/34
(58) Field of Classification Search ............... None
See application file for complete search history.

(56) References Cited

U.S. PATENT DOCUMENTS

| | | | |
|---|---|---|---|
| 5,075,640 A | | 12/1991 | Miyazawa |
| 5,278,522 A | | 1/1994 | Atriss et al. |
| 5,374,904 A | * | 12/1994 | Ishibashi ............... 331/17 |
| 5,963,058 A | * | 10/1999 | Thomas ............... 327/3 |
| 6,028,488 A | | 2/2000 | Landman et al. |
| 6,308,055 B1 | * | 10/2001 | Welland et al. ........ 455/260 |
| 6,414,535 B1 | * | 7/2002 | Ooishi ............... 327/538 |
| 6,842,082 B2 | * | 1/2005 | Tan ............... 331/175 |

FOREIGN PATENT DOCUMENTS

| | | |
|---|---|---|
| DE | 10 2005 058 137 A1 | 6/2006 |
| JP | 2004-120215 | 4/2004 |
| KR | 100272524 B1 | 8/2000 |
| KR | 1020030054196 A | 7/2003 |

OTHER PUBLICATIONS

Young et al., "A PLL Clock Generator with 5 to 110 MHz of Lock Range of Microprocessors," IEEE Journal of Solid-State Circuits, vol. 27, No. 11, Nov. 1992, pp. 1599-1607.
Office Action, German Application No. 10 2005 063 232.7-35, Feb. 26, 2007.

* cited by examiner

*Primary Examiner*—Cassandra Cox
(74) *Attorney, Agent, or Firm*—Myers Bigel Sibley & Sajovec, PA (57) ABSTRACT

A phase locked loop (PLL) integrated circuit includes a voltage-controlled oscillator (VCO) configured to generate a clock signal at an output terminal thereof. The VCO is further configured to improve the frequency response of the PLL by varying a capacitance of the output terminal concurrently with changing a frequency of the clock signal. The VCO may include a control signal generator, which is configured to generate a plurality of control signals in response to UP and DOWN pumping signals, and an oscillator, which is configured to generate the clock signal in response to the plurality of control signals. The oscillator may be a ring oscillator, which is responsive to the plurality of control signals.

15 Claims, 5 Drawing Sheets

PHASE LOCKED LOOP HAVING ENHANCED LOCKING CHARACTERISTICS

REFERENCE TO PRIORITY APPLICATION

This application claims priority to Korean Application No. 2004-111107, filed Dec. 23, 2004, the disclosure of which is hereby incorporated herein by reference.

FIELD OF THE INVENTION

The present invention relates to integrated circuit devices and, more particularly, to phase locked loop integrated circuits.

BACKGROUND OF THE INVENTION

Figure 1:
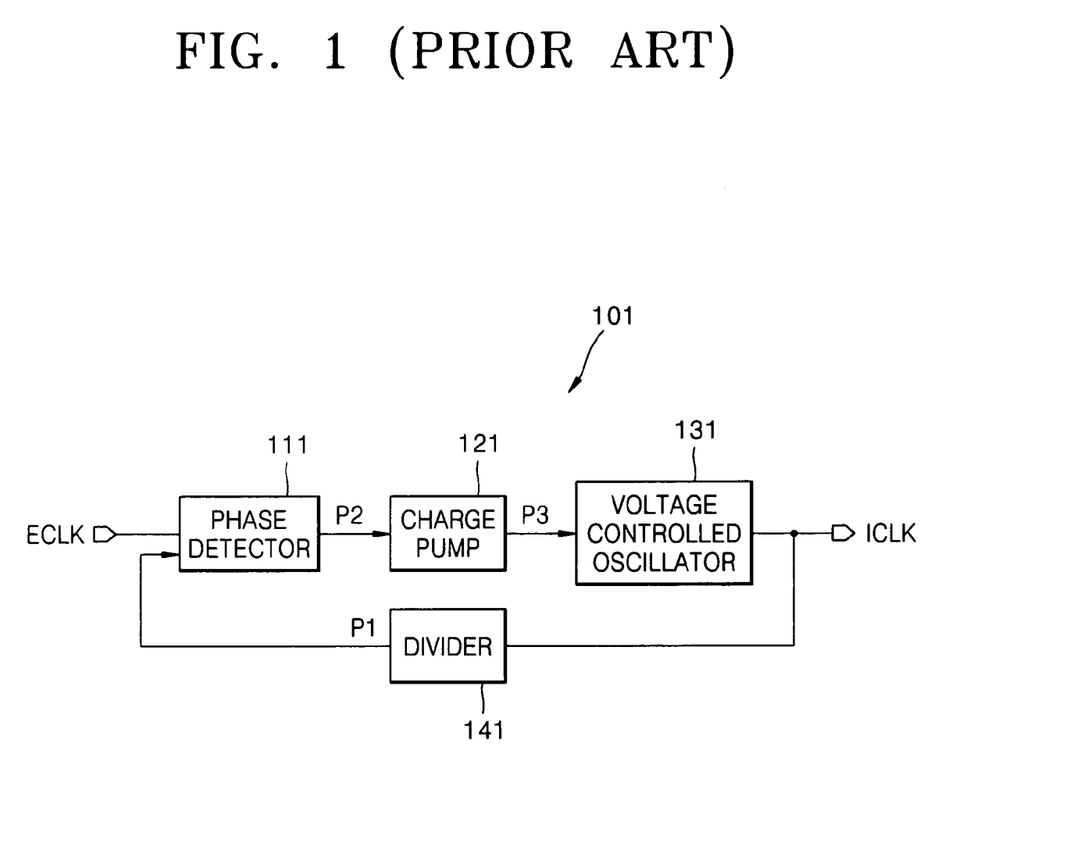
FIG. 1 is a block diagram of a conventional phase locked loop (PLL) device.

FIG. 1 is a block diagram of a conventional phase locked loop (PLL) device 101. Referring to FIG. 1, the PLL device 101 includes a phase detector 111, a charge pump 121, a voltage controller oscillator 131, and a divider 141. The phase detector 111 compares a phase of an external clock signal ECLK input from an external source with that of a dividing signal P1 output from the divider 141, detects a phase difference between the external clock signal ECLK and the dividing signal P1, and outputs a phase difference signal P2. The charge pump 121 receives the phase difference signal P2 and outputs a pumping signal P3. The voltage-controlled oscillator 131 receives the pumping signal P3 and outputs an internal clock signal ICLK. The divider 141 transmits to the phase detector 111 the dividing signal P1 obtained by dividing the internal clock signal ICLK at a predetermined rate.

The PLL device 101 performs a locking operation until a frequency of the internal clock signal ICLK is locked to that of the external clock signal ECLK. To this end, the PLL device 101 includes a load capacitor (not shown) at an output terminal of the voltage-controlled oscillator 131. The voltage controlled oscillator 131 controls the amount of electric current that flows through the load capacitor to adjust the frequency of the internal clock signal ICLK.

Specifically, when the frequency of the external clock signal ECLK is higher than that of the internal clock signal ICLK, a large amount of electric current is supplied to the load capacitor such that the frequency of the internal clock signal is raised. When the frequency of the external clock signal ECLK is lower than that of the internal clock signal ICLK, a small amount of electric current is supplied to the load capacitor such that the frequency of the internal clock signal is lowered.

In this way, when the frequency of the external clock signal ECLK is higher than that of the internal clock signal ICLK, a large amount of electric current flows through the output terminal of the voltage controlled oscillator 131, thereby increasing power consumption. When the frequency of the external clock signal ECLK is lower than that of the internal clock signal ICLK, a smaller amount of electric current flows through the output terminal of the voltage-controlled oscillator 131. Thus, the internal clock signal ICLK may be greatly affected by noise, which, in turn, narrows an operating frequency range of the internal clock signal ICLK.

SUMMARY OF THE INVENTION

The present invention provides a phase locked loop (PLL) device that decreases electric current supplied to an output terminal thereof when a frequency of an input signal is higher than that of an output signal and increases the electric current supplied to the output terminal thereof when the frequency of the input signal is lower than that of the output signal.

According to an embodiment of the present invention, there is provided a phase locked loop device receiving an external signal input from an external source and generating an internal signal. The device includes a phase detector receiving the external signal and a fed back internal signal and detecting a phase difference between the external and internal signals. A charge pump for generating a pumping signal in response to an output signal of the phase detector is also provided. A voltage controlled oscillator generates the internal signal in response to the pumping signal, decreases electric current consumed at an output terminal of the voltage controlled oscillator when a frequency of the external signal is higher than that of the internal signal, and increases the electric current consumed at the output terminal of the voltage controlled oscillator when the frequency of the external signal is lower than that of the internal signal.

According to another embodiment of the present invention, there is provided a phase locked loop device receiving an external clock signal input from an external source and generating an internal clock signal. The device includes a phase detector receiving the external clock signal and a fed back internal clock signal and detecting a phase difference between the external and internal clock signals. A charge pump is provided for generating a pumping signal in response to an output signal of the phase detector. A voltage-controlled oscillator is provided for receiving the pumping signal and generating the internal clock signal in response to the pumping signal.

The voltage controlled oscillator includes a control signal generator receiving the pumping signal, and generating a deactivated variable control signal when a frequency of the external clock signal is higher than that of the internal clock signal and generating an activated variable control signal when the frequency of the external clock signal is lower than that of the internal clock signal. The oscillator includes an inverting unit, which receives the fed back internal clock signal and outputs the internal clock signal, and a load capacitor connected to an output terminal of the inverting unit in parallel. A MOS transistor is connected to the load capacitor in series, and is activated when the variable control signal is active, and deactivated when the variable control signal is inactive.

According to another embodiment of the present invention, there is provided a phase locked loop device receiving an external signal input from an external source and generating an internal signal. The device includes a phase detector receiving the external signal and a fed back internal signal and detecting a phase difference between the external and internal signals. A charge pump is provided for receiving an output signal of the phase detector and generating an up-pumping signal when a frequency of the external signal is higher than that of the internal signal and generating a down-pumping signal when the frequency of the external signal is lower than that of the internal signal. A voltage controlled oscillator includes a control signal generator, which receives the up-pumping signal and the down-pumping signal and generates first and second control signals activated when the up-pumping signal is active and a variable control signal activated when the down-pumping signal is active, and an internal signal generator. The internal signal generator receives the first and second control signals and the variable control signal, generates the internal signal, decreases electric current consumed at an output terminal of the internal signal generator when the first and second control signals are active and the variable control signal is inactive, and increases the electric current consumed at the output terminal of the internal signal generator when the first and second control signals are inactive and the variable control signal is active.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth therein; rather, these embodiments are provided so that this disclosure will be thorough and complete, and will fully convey the concept of the invention to those skilled in the art. Like reference numerals in the drawings denote like elements, and thus their description will be omitted.

Figure 2:
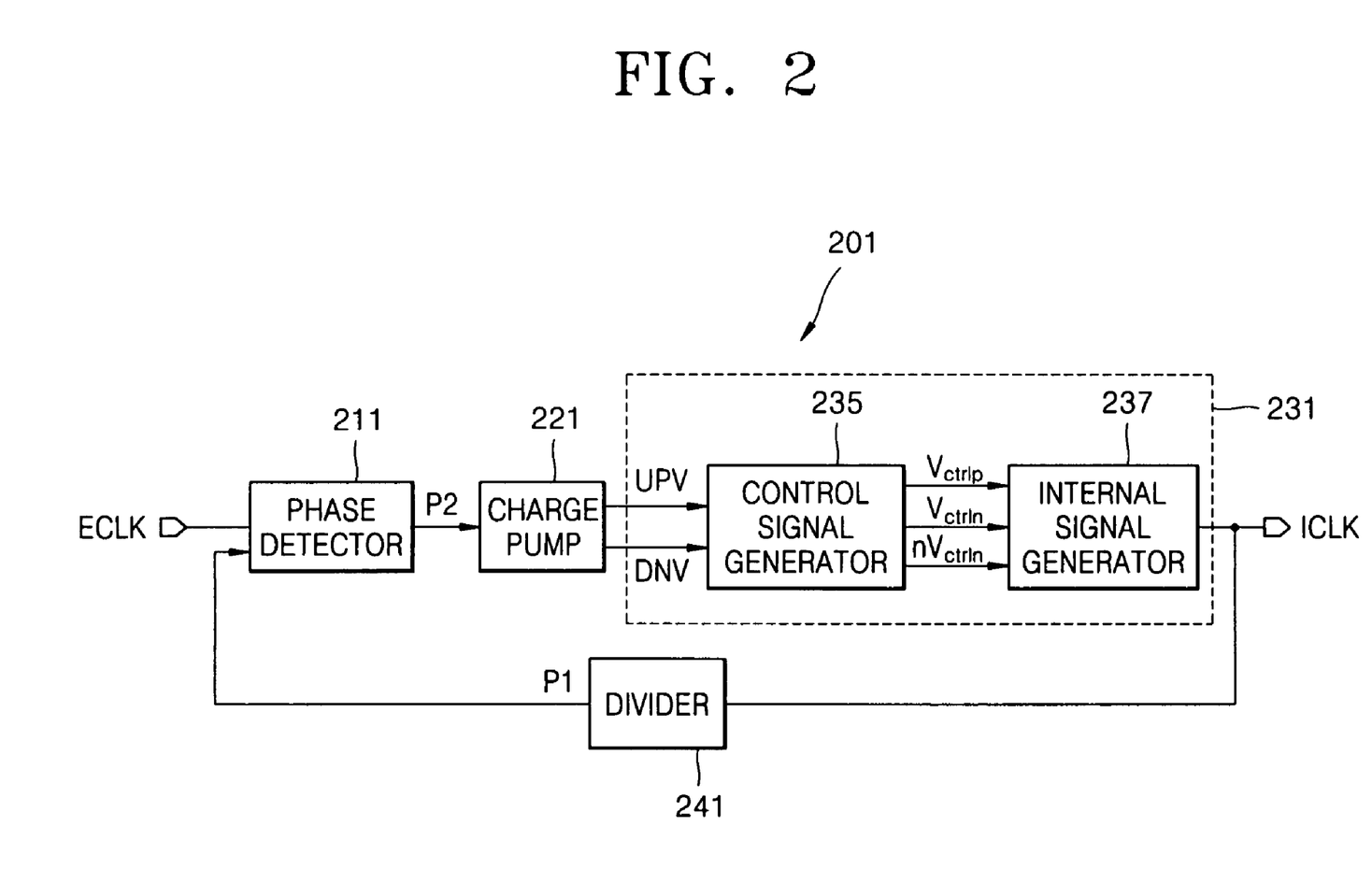
FIG. 2 is a block diagram of a PLL device according to the present invention.

FIG. 2 is a block diagram of a phase locked loop (PLL) device 201 according to the present invention. Referring to FIG. 2, the PLL device 201 includes a phase detector 211, a charge pump 221, a voltage controller oscillator 231, and a divider 241. The phase detector 211 compares a phase of a signal input from an external source, (e.g., an external clock signal ECLK), with that of a dividing signal P1 output from the divider 241, detects a phase difference between the external clock signal ECLK and the dividing signal P1, and outputs a phase difference signal P2.

The charge pump 221 receives the phase difference signal P2 output from the phase detector 211 and outputs pumping signals UPV and DNV. When a frequency of the external clock signal ECLK is higher than that of an internal clock signal ICLK, the charge pump 221 outputs an up-pumping signal UPV. When the frequency of the external clock signal ECLK is lower than that of an internal clock signal ICLK, the charge pump 221 outputs a down-pumping signal DNV. The voltage-controlled oscillator 231 receives the up-pumping signal UPV and the down-pumping signal DNV and outputs the internal clock signal ICLK. The voltage-controlled oscillator 231 includes a control signal generator 235 and an internal signal generator 237.

The control signal generator 235 receives the up-pumping signal UPV and the down-pumping signal DNV and outputs a first control signal Vctrlp, a second control signal Vctrln, and a variable control signal nVctrln. When the up-pumping signal UPV is activated, the first and second control signals Vctrlp and Vctrln are activated and the variable control signal nVctrln is deactivated. When the down-pumping signal DNV is activated, the first and second control signals Vctrlp and Vctrln are deactivated and the variable control signal nVctrln is activated. The control signal generator 235 will later be described in more detail with reference to FIG. 3.

The internal signal generator 237 receives the first and second control signals Vctrlp and Vctrln and the variable control signal nVctrln and generates an internal signal, (e.g., the internal clock signal ICLK). When the first and second control signals Vctrlp and Vctrln are activated, a large amount of electric current flows through an output terminal of the internal signal generator 237, thereby raising the frequency of the internal clock signal ICLK. In this case, the variable control signal nVctrln is deactivated, thereby decreasing the amount of electric current consumed by the output terminal of the voltage-controlled oscillator 231.

Conversely, when the first and second control signals Vctrlp and Vctrln are deactivated, a small amount of electric current flows through the output terminal of the internal signal generator 237, thereby lowering the frequency of the internal clock signal ICLK. In this case, the variable control signal nVctrln is activated, thereby increasing the amount of electric current consumed by the output terminal of the voltage-controlled oscillator 231. The internal signal generator 237 will later be described in more detail with reference to FIG. 4. The divider 141 receives the internal clock signal ICLK, divides the internal clock signal ICLK at a predetermined rate, and transmits the divided internal clock signal ICLK to the phase detector 211.

Figure 3:
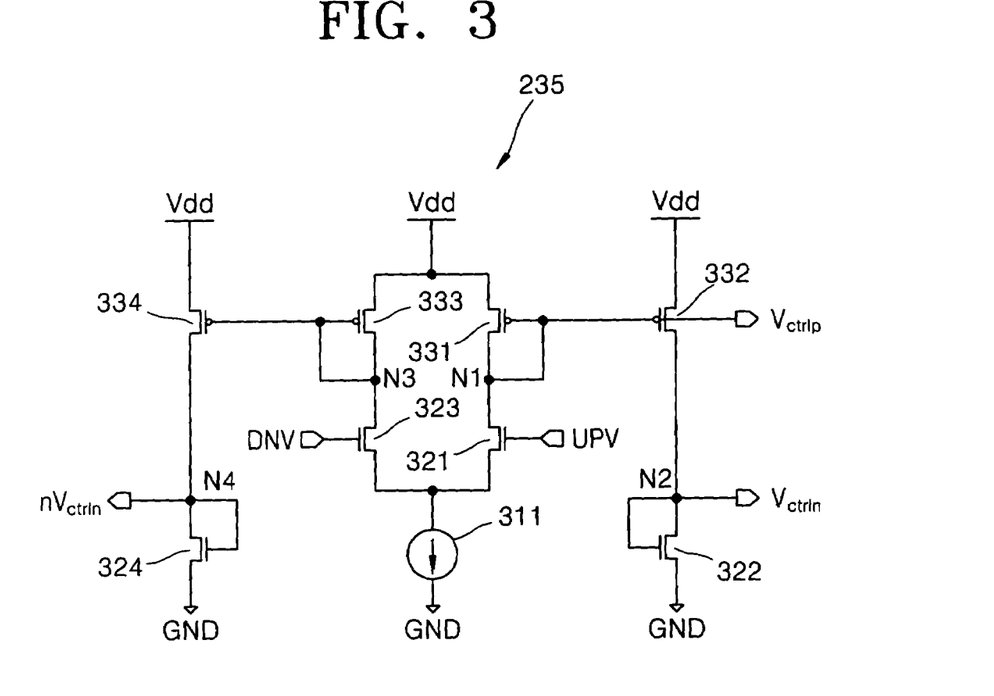
FIG. 3 is a detailed circuit diagram of a control signal generator of FIG. 2.

FIG. 3 is a detailed circuit diagram of the control signal generator 235 of FIG. 2. Referring to FIG. 3, the control signal generator 235 includes the electric current source 311, first through fourth NMOS transistors 321 through 324, and first through fourth PMOS transistors 331 through 334. The electric current source 311 maintains a constant sum of electric currents flowing from the first and third NMOS transistors 321 and 323 to a ground GND.

The first NMOS transistor 321 is connected between the electric current source 311 and a first node N1. The up-pumping signal UPV is transmitted to a gate of the first NMOS transistor 321. When the up-pumping signal UPV is active in a high level, the first NMOS transistor 321 is activated. When the up-pumping signal UPV is inactive in a low level, the first NMOS transistor 321 is deactivated. When the first NMOS transistor 321 is activated, the first control signal Vctrlp generated in the first node N1 becomes inactive to a low level. When the first NMOS transistor 321 is deactivated, the first control signal Vctrlp generated in the first node N1 becomes active to a high level.

The first PMOS transistor 331 is connected between a voltage source VDD and the first node N1 and a gate of the first PMOS transistor 331 is connected to the first node N1. Therefore, the first PMOS transistor 331 is turned on or off by the first control signal Vctrlp. The second PMOS transistor 332 is connected between the voltage source VDD and a second node N2 and the first control signal Vctrlp is transmitted to a gate of the second PMOS transistor 332. Therefore, the second PMOS transistor 332 is turned on or off by the first control signal Vctrlp. The second NMOS transistor 322 is connected between the second node N2 and the ground GND, and a gate of the second NMOS transistor 322 is connected to the second node N2.

Therefore, the second NMOS transistor 322 is turned on or off by a voltage generated in the second node N2. Since the second NMOS transistor 322 is manufactured to have a small size, it has a large internal resistance when turned on.

The second node N2 generates the second control signal Vctrln. Therefore, when the second PMOS transistor 332 is activated, the second control signal Vctrln becomes active to a high level and when the second PMOS transistor 332 is deactivated, the second control signal Vctrln becomes inactive to a low level. In other words, when the first control signal Vctrlp is set to a low level, the second control signal Vctrln is set to a high level. When the first control signal Vctrlp is set to a high level, the second control signal Vctrln is set to a low level. In this way, the first and second control signals Vctrlp and Vctrln have opposite voltage levels.

The third NMOS transistor 323 is connected between the electric current source 311 and a third node N3. The down-pumping signal DNV is transmitted to a gate of the third NMOS transistor 323. When the down-pumping signal DNV is active in a high level, the third NMOS transistor 323 is activated. When the down-pumping signal DNV is inactive in a low level, the third NMOS transistor 323 is deactivated. When the third NMOS transistor 323 is activated, the third node N3 is lowered to a low level. When the third NMOS transistor 323 is deactivated, the third node N3 is raised to a high level.

The third PMOS transistor 333 is connected between the voltage source VDD and the third node N3 and a gate of the third PMOS transistor 333 is connected to the third node N3. Therefore, the third PMOS transistor 333 is turned on or off by a voltage generated at the third node N3. The fourth PMOS transistor 334 is connected between the voltage source VDD and a fourth node N4 and a gate of the fourth PMOS transistor 334 is connected to the third node N3. Therefore, the fourth PMOS transistor 334 is turned on or off by the voltage generated at the third node N3.

The fourth NMOS transistor 324 is connected between the fourth node N4 and the ground GND, and a gate of the fourth NMOS transistor 324 is connected to the fourth node N4. Therefore, the fourth NMOS transistor 324 is turned on or off by a voltage generated at the fourth node N4. Since the fourth NMOS transistor 324 is manufactured to have a small size, it has a large internal resistance when turned on.

The fourth node N4 generates the variable control signal nVctrln. Therefore, when the fourth PMOS transistor 334 is activated, the variable control signal nVctrln becomes set to a high level and when the fourth PMOS transistor 334 is deactivated, the variable control signal nVctrln becomes set to a low level. In other words, when the second control signal Vctrln is set to a high level, the variable control signal nVctrln is set to a low level. When the second control signal Vctrln is set to a low level, the variable control signal nVctrln is set to a high level. In this way, the variable control signal nVctrln and the second control signals Vctrln have opposite voltage levels.

Figure 4:
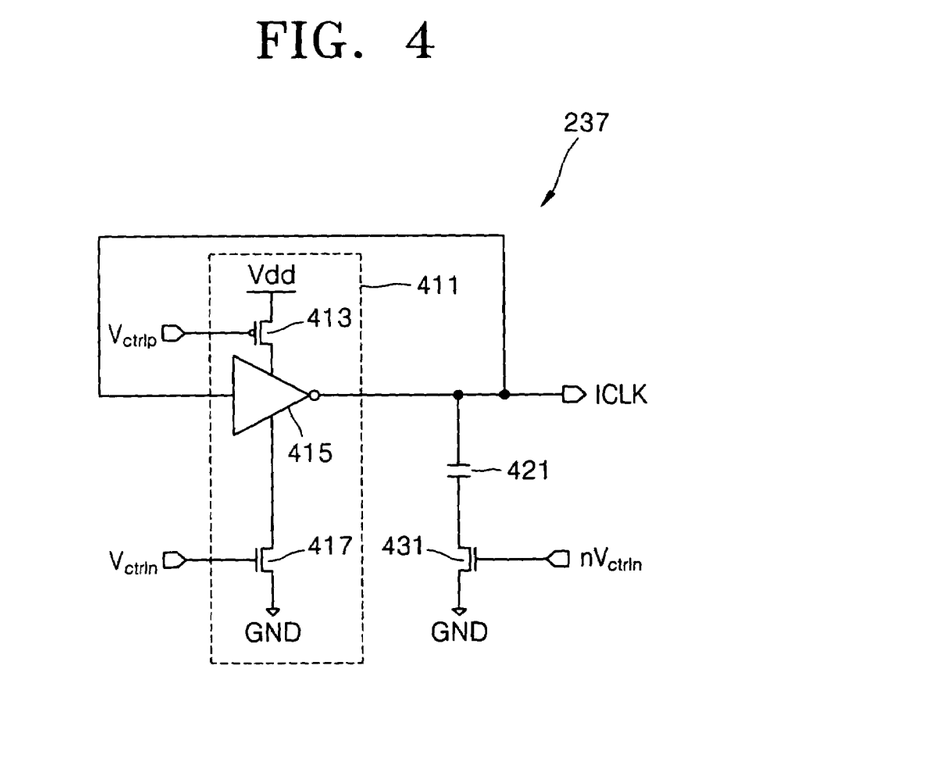
FIG. 4 is a detailed circuit diagram of an internal signal generator of FIG. 2 according to an embodiment of the present invention.

FIG. 4 is a detailed circuit diagram of the internal signal generator 237 of FIG. 2. Referring to FIG. 4, the internal signal generator 237 includes an inverting unit 411, a load capacitor 421, and a variable control transistor 431. The inverting unit 411 receives the first and second control signals Vctrlp and Vctrln and the fed back internal clock signal ICLK, inverts the fed back internal clock signal ICLK in response to the first and second control signals Vctrlp and Vctrln, and outputs the internal clock signal ICLK. The inverting unit 411 includes a first control transistor 413, an inverter 415, and a second control transistor 417.

The first control transistor 413 is connected between the voltage source VDD and the inverter 415. The first control signal Vctrlp is transmitted to a gate of the first control transistor 413. Therefore, the first control transistor 413 is activated when the first control signal Vctrlp is a low level and supplies the voltage source VDD to the inverter 415. The first control transistor 413 is deactivated when the first control signal Vctrlp is a high level. The first control transistor 413 may be a PMOS transistor. The second control transistor 417 is connected between the inverter 415 and the ground GND. The second control signal Vctrln is transmitted to a gate of the second control transistor 417. Therefore, the second control transistor 417 is activated when the second control signal Vctrln is a high level and supplies ground voltage to the inverter 415. The second control transistor 417 is deactivated when the second control signal Vctrln is a low level. The second control transistor 417 may be an NMOS transistor. The inverter 415 receives and inverts the fed back internal clock signal ICLK and outputs the internal clock signal ICLK.

The load capacitor 421 and the variable control transistor 431 are connected in series at an output terminal of the inverting unit 411. The variable control transistor 431 may be an NMOS transistor. The variable control signal nVctrln is transmitted to a gate of the variable control transistor 431. Therefore, the variable control transistor 431 is activated when the variable control signal nVctrln is a high level and increases the capacitance of the load capacitor 421. The variable control transistor 431 is deactivated when the variable control signal nVctrln is a low level and decreases the capacitance of the load capacitor 421.

Consequently, the capacitance of the load capacitor 421 decreases when the frequency of the external clock signal ECLK is higher than that of the internal clock signal ICLK and increases when the frequency of the external signal ECLK is lower than that of the internal clock signal ICLK. In this way, the capacitance of the load capacitor 421 varies according to the frequency of the internal clock signal ICLK.

The overall operation of the PLL device 201 will now be described with reference to FIGS. 2 through 4. A case where the frequency of the external clock signal ECLK is higher than that of the internal clock signal ICLK will be described. The charge pump 221 activates the up-pumping signal UPV to a high level. When the up-pumping signal UPV is a high level, the first signal Vctrlp and the variable control signal nVctrln are output in a low level and the second control signal Vctrln is output in a high level.

As the first signal Vctrlp is inactive in a low level and the second control signal Vctrln is active in a high level, the first and second control transistors 413 and 417 are activated. Thus, a large amount of electric current flows from the inverter 415 to the load capacitor 421, thereby raising the frequency of the internal clock signal ICLK. Here, as the variable control signal nVctrln is inactive in a low level, the variable control transistor 431 is deactivated. Thus, the capacitance of the load capacitor 421 decreases. Accordingly, the amount of electric current flowing from the inverter 415 to the load capacitor 421 decreases, and thus the amount of electric current consumed by the output terminal of the voltage controlled oscillator 231 is reduced. In this way, when the frequency of the external clock signal ECLK is higher than that of the internal clock signal ICLK, the amount of electric current consumed by the load capacitor 421 is reduced, thereby expanding a frequency region of the internal clock signal ICLK to a higher range. In other words, when the frequency of the external clock signal ECLK is higher than that of the internal clock signal ICLK, electric current output from the inverting unit 411 increases and, at the same time, the capacitance of the load capacitor 421 decreases. Therefore, the internal clock signal ICLK becomes synchronized with the external clock signal ECLK more quickly.

Next, a case where the frequency of the external clock signal ECLK is lower than that of the internal clock signal ICLK will be described. The charge pump 221 activates the down-pumping signal DNV to a high level. When the down-pumping signal DNV is a high level, the first signal Vctrlp and the variable control signal nVctrln are output in a high level and the second control signal Vctrln is output in a low level.

As the first signal Vctrlp is active in a high level and the second control signal Vctrln is inactive in a low level, the first and second control transistors 413 and 417 are deactivated. Thus, a very small amount of electric current flows from the inverter 415 to the load capacitor 421, thereby lowering the frequency of the internal clock signal ICLK. Here, as the variable control signal nVctrln is active in a high level, the variable control transistor 431 is activated. Thus, the capacitance of the load capacitor 421 increases. Accordingly, the amount of electric current flowing from the inverter 415 to the load capacitor 421 increases, and thus the amount of electric current consumed by the output terminal of the voltage controlled oscillator 231 increases. In this way, when the frequency of the external clock signal ECLK is lower than that of the internal clock signal ICLK, the amount of electric current consumed by the load capacitor 421 increases and the internal clock signal ICLK is less affected by noise. Therefore, a frequency region of the internal clock signal ICLK is expanded to a lower range.

Figure 5:
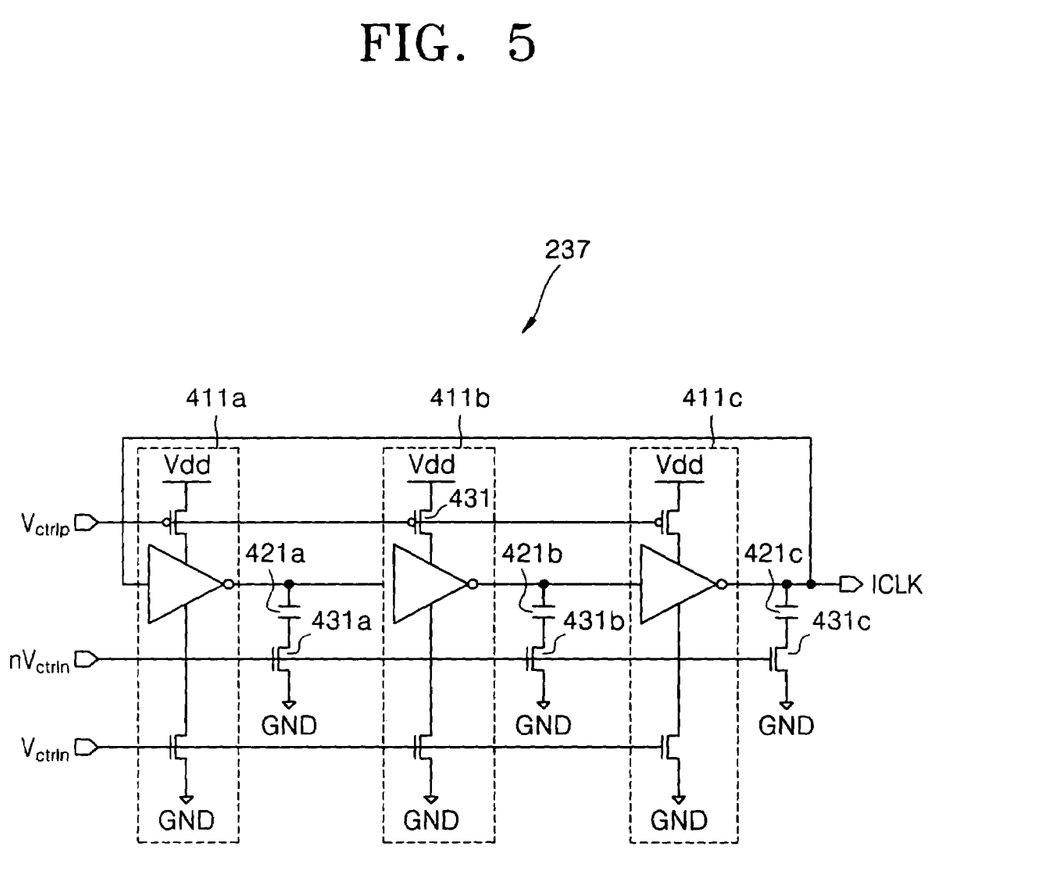
FIG. 5 is a circuit diagram of an internal signal generator according to another embodiment of the present invention.

FIG. 5 is a circuit diagram of an internal signal generator 237 according to another embodiment of the present invention. Referring to FIG. 5, the internal signal generator 237 includes a plurality of inverting units 411a through 411c, a plurality of load capacitors 421a through 421c, and a plurality of variable control transistors 431a through 431c. Here, odd numbers of inverting units 411a through 411c, load capacitors 421a through 421c, and variable control transistors 431a through 431c are formed. The configurations and operations of the inverting units 411a through 411c, the load capacitors 421a through 421c, and the variable control transistors 431a through 431c are identical to the inverting unit 411, the load capacitor 421, and the variable control transistor 431. Thus, their description will be omitted.

Figure 6:
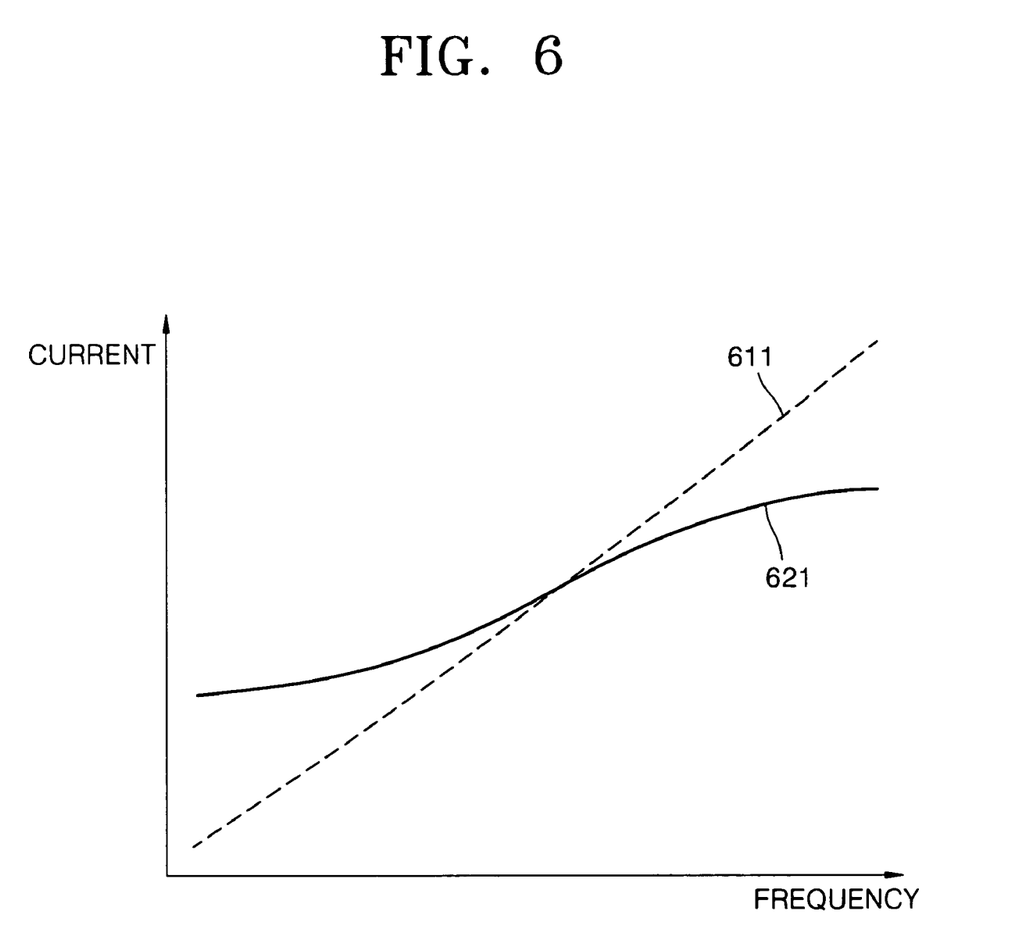
FIG. 6 is a graph for comparing electric current consumed by a load capacitor included in a voltage controlled oscillator of the conventional PLL device with electric current consumed by a load capacitor included in a voltage controlled oscillator of the PLL device of the present invention.

FIG. 6 is a graph for comparing electric current 611 consumed by the load capacitor included in the voltage controlled oscillator 131 of the conventional PLL device 101 of FIG. 1 with electric current 621 consumed by the load capacitor 421 of FIG. 4 included in the voltage controlled oscillator 231 of FIG. 4 of the PLL device 201 of FIG. 2 of the present invention. Referring to FIG. 6, the electric current 611 consumed by the conventional load capacitor is small at a low frequency and large at a high frequency. Conversely, the electric current 621 consumed by the load capacitor 421 of FIG. 4 of the present invention is much larger than the electric current 611 consumed by the conventional load capacitor at a low frequency and much smaller at a high frequency.

As described above, a load capacitor is connected to a variable control transistor. When a frequency of an external clock signal is higher than that of an internal clock signal, an inactivated variable control signal nVctrln is transmitted to the variable control transistor. Accordingly, the variable control transistor is inactivated, thereby decreasing capacitance of the load capacitor. When the frequency of the external clock signal is lower than that of the internal clock signal, an activated variable control signal nVctrln is transmitted to the variable control transistor. Accordingly, the variable control transistor is activated, thereby increasing the capacitance of the load capacitor.

Therefore, when the frequency of the external clock signal ECK is higher than that of the internal clock signal ICLK, electric current consumed by the load capacitor decreases and, thus, the internal clock signal can be synchronized with the external clock signal more quickly. When the frequency of the external clock signal is lower than that of the internal clock signal, the electric current consumed by the load capacitor increases and, thus, the internal clock signal is less affected by noise. Accordingly, an operating frequency range of a phase locked loop device is expanded.

Accordingly, as described above, embodiments of the present invention include phase locked loop (PLL) integrated circuits having enhanced locking characteristics. These PLL integrated circuits include a voltage-controlled oscillator 231, which is configured to generate a clock signal (ICLK) at an output terminal. The voltage-controlled oscillator 231 is further configured to vary a capacitance of the output terminal concurrently with changing a frequency of the clock signal ICLK. As illustrated by FIGS. 2-4, the voltage-controlled oscillator 231 includes a control signal generator 235, which is configured to generate a plurality of control signals (e.g., Vctrlp, Vctrln and nVctrln) in response to UP and DOWN pumping signals (UPV and DNV), and an internal signal generator 237. This internal signal generator 237 represents an oscillator, which is configured to generate the clock signal ICLK in response to the plurality of control signals Vctrlp, Vctrln and nVctrln. As illustrated by FIG. 4, the oscillator includes at least one inverter 415 having a pull-up path and a pull-down path. The pull-up path includes a PMOS transistor 413 and the pull-down path includes an NMOS transistor 417. An impedance of the pull-up path (e.g., impedance of PMOS transistor 413) is controlled by a magnitude of a first control signal Vctrlp and an impedance of the pull-down path (e.g., impedance of NMOS transistor 417) is controlled by a magnitude of a second control signal Vctrln. The oscillator also includes a load capacitor 421 having a first electrode electrically connected to the output terminal. An NMOS transistor 431, which has a current carrying terminal (e.g., drain terminal) electrically connected to a second electrode of the load capacitor 421 and a gate terminal responsive to a third control signal nVctrln, operates to control the capacitive loading on the output terminal. As illustrated by FIG. 5, the oscillator may be configured as a multi-stage ring oscillator, with each stage (411a-411c) including a respective inverter. An output of each stage of the multi-stage ring oscillator in FIG. 5 is electrically connected to respective load capacitor (421a-421c).

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A phase locked loop integrated circuit, comprising:
a voltage controlled oscillator configured to generate a clock signal at an output terminal thereof and further configured to vary a capacitance of the output terminal concurrently with changing a frequency of the clock signal, said voltage controlled oscillator comprising:

a control signal generator configured to generate a plurality of control signals in response to UP and DOWN pumping signals; and an oscillator configured to generate the clock signal in response to the plurality of control signals.

2. The circuit of claim 1, wherein said oscillator comprises at least one inverter having a pull-up path and a pull-down path; wherein an impedance of the pull-up path is controlled by a magnitude of a first of the plurality of control signals; and wherein an impedance of the pull-down path is controlled by a magnitude of a second of the plurality of control signals.

3. The circuit of claim 2, wherein said oscillator comprises:

a load capacitor having a first electrode electrically connected to the output terminal; and a transistor having a current carrying terminal electrically connected to a second electrode of said load capacitor and a gate terminal responsive to a third of the plurality of control signals.

4. The circuit of claim 1, wherein said oscillator comprises a multi-stage ring oscillator.

5. The circuit of claim 4, wherein an output of each stage of the multi-stage ring oscillator is electrically connected to respective load capacitor.

6. The circuit of claim 4, wherein pull-up and pull-down paths within each stage of the multi-stage ring oscillator have impedances controlled by corresponding ones of the plurality of control signals.

7. The circuit of claim 5, wherein a capacitance at an output of each stage of the multi-stage ring oscillator is varied in response to one of the plurality of control signals.

8. A phase locked loop device receiving an external clock signal input from an external source and generating an internal clock signal, the device comprising:

a phase detector receiving the external clock signal and a fed back internal clock signal and detecting a phase difference between the external and internal clock signals;

a charge pump generating a pumping signal in response to an output signal of the phase detector; and a voltage controlled oscillator receiving the pumping signal and generating the internal clock signal in response to the pumping signal, wherein the voltage-controlled oscillator comprises:

a control signal generator receiving the pumping signal, and generating a deactivated variable control signal when a frequency of the external clock signal is higher than that of the internal clock signal and generating an activated variable control signal when the frequency of the external clock signal is lower than that of the internal clock signal;

an inverting unit receiving the fed back internal clock signal and outputting the internal clock signal;

a load capacitor connected to an output terminal of the inverting unit in parallel; and a MOS transistor connected to the load capacitor in series, activated when the variable control signal is active, and deactivated when the variable control signal is inactive.

9. A phase locked loop device receiving an external signal input from an external source and generating an internal signal, the device comprising:

a phase detector receiving the external signal and a fed back internal signal and detecting a phase difference between the external and internal signals;

a charge pump receiving an output signal of the phase detector and generating an up-pumping signal when a frequency of the external signal is higher than that of the internal signal and generating a down-pumping signal when the frequency of the external signal is lower than that of the internal signal; and a voltage controlled oscillator comprising a control signal generator, which receives the up-pumping signal and the down-pumping signal and generates first and second control signals activated when the up-pumping signal is active and a variable control signal activated when the down-pumping signal is active, and an internal signal generator, which receives the first and second control signals and the variable control signal, generates the internal signal, decreases electric current consumed at an output terminal of the internal signal generator when the first and second control signals are active and the variable control signal is inactive, and increases the electric current consumed at the output terminal of the internal signal generator when the first and second control signals are inactive and the variable control signal is active.

10. The device of claim 9, wherein the external signal is an external clock signal and the internal signal is an internal clock signal.

11. The device of claim 9, wherein the control signal generator comprises:

an electric current source providing constant electric current;

first through fourth nodes;

a first NMOS transistor connected between the electric current source and the first node and generating the first control signal from the first node in response to the up-pumping signal transmitted to a gate of the first NMOS transistor;

a first PMOS transistor connected between the first node and a voltage source;

a second PMOS transistor connected between the second node and the voltage source and generating the second control signal from the second node in response to the first control signal transmitted to a gate of the second PMOS transistor;

a second NMOS transistor connected between the second node and a ground;

a third NMOS transistor connected between the third node and the electric current source and receiving the down-pumping signal transmitted to a gate thereof;

a third PMOS transistor connected between the third node and the voltage source;

a fourth PMOS transistor connected between the fourth node and the voltage source and generating the variable control signal from the fourth node in response to a voltage of the third node applied to a gate of the fourth PMOS transistor; and a fourth NMOS transistor connected between the fourth node and the ground.

12. The device of claim 9, wherein the internal signal generator comprises:

an inverting unit receiving the first and second control signals and the fed back internal signal and generating the internal signal in response to the first and second control signals;

a load capacitor connected to an output terminal of the inverting unit in parallel; and a variable control transistor connected between the load capacitor and the ground, activated when the variable control signal is active, and deactivated when the variable control signal is inactive.

13. The device of claim 12, wherein the variable control transistor has a drain connected to the load capacitor, a source connected to the ground, and a gate to which the variable control signal is applied.

14. The device of claim 12, wherein the inverting unit comprises:
    an inverter receiving the fed back internal signal and outputting the internal signal;
    a first control transistor connected between the voltage source and the inverter, having a gate to which the first control signal is applied, activated when the first control signal is a low level, and supplying a voltage output from the voltage source to the inverter; and
    a second control transistor connected between the ground and the inverter, having a gate to which the second control signal is applied, activated when the second control signal is a high level, and supplying a ground voltage to the inverter.

15. The device of claim 12, wherein odd numbers of inverting units, load capacitors, and variable control transistors are formed.

* * * * *